United States Patent

[11] 3,597,081

[72] Inventors Donald Norman Cason
Oconomowoc, Wis.;
Robert Louis Schaefer, Huntington Beach, Calif.
[21] Appl. No. 680,233
[22] Filed Nov. 2, 1967
[45] Patented Aug. 3, 1971
[73] Assignee Continental Device Corporation

[54] VACUUM MASKING SYSTEM AND METHOD
3 Claims, 4 Drawing Figs.

[52] U.S. Cl. ........................ 355/91, 355/73, 355/76
[51] Int. Cl. ........................ G03b 27/20
[50] Field of Search ........................ 355/73, 79, 87, 91, 132, 133

[56] References Cited

UNITED STATES PATENTS

| | | | |
|---|---|---|---|
| 2,905,428 | 9/1959 | Ribesehl | 355/73 X |
| 3,229,953 | 1/1966 | Muir | 248/363 |
| 3,237,543 | 3/1966 | Hoffman | 355/73 X |
| 3,259,046 | 7/1966 | Nishimura | 355/73 X |
| 3,306,176 | 2/1967 | Myers | 355/91 |

*Primary Examiner*—John M. Horan
*Assistant Examiner*—E. M. Bero
*Attorney*—Nilsson, Robbins

ABSTRACT: The application discloses a vacuum actuated holding jig for use in the process of manufacturing semiconductor wafer elements. The jig is a small integral unit having two vacuum chambers therewithin each communicating with different areas on the wafer rubber mounting surface. A wafer may be temporarily held by one set of capillaries while a mask is emplaced thereover and clamped by a second set of capillaries. The first vacuum may then be released. The second vacuum is held by a toggle switch mounted on the jig unit whereby the vacuum secured jig-wafer-mask assembly may be removed from the vacuum system and handled independently for further processing.

PATENTED AUG 3 1971 3,597,081

DONALD NORMAN CASON
ROBERT LOUIS SCHAEFER
INVENTORS

BY Nilsson, Robbins & Anderson
ATTORNEYS

VACUUM MASKING SYSTEM AND METHOD

BACKGROUND OF THE INVENTION

This invention relates generally to the manufacture of electron device components and more particularly to an improved mask and wafer aligning jig and process.

Although the present invention achieves particularly useful application in the field of manufacturing semiconductor wafer elements, and although, in the cause of brevity and clarity of presentation, much of the following discussion of examples of the invention are directed theretoward, it is expressly to be understood that the invention is not limited thereto and that the advantages of the invention are equally well manifest in other fields where it is desired to hold a plurality of relatively delicate parts in a prescribed alignment for s subsequent processing.

The example, then, to be considered in detail is that of aligning a mask as for forming a transistor base element over a photosensitive wafer to be photoexposed at a later step in the process of manufacturing the base electrode, for example, of the semiconductor device.

DESCRIPTION OF THE PRIOR ART

As is well understood from conventional practice, the manufacture of semiconductor elements requires at certain points of considerable precision in the alignment of the various electrodes and, consequently, an equivalent precision in the alignment of the masking used in forming the separate electrode. However, there are various other steps which do not require extreme precision.

In accordance with prior art techniques, it is typical procedure to utilize precision equipment and method including microscope alignment at various steps in the process even though the process steps neither inherently require such precision nor benefit therefrom. Typically, also the precision equipment for achieving the alignment, is, if needed at all, fully occupied from the beginning to the end of the process concerned with the particular element. Thus considerably expense is incurred because of such nonessential utilization or redundant or otherwise nonbeneficial precision processes, thereby requiring more time in the process, and because expensive capital equipment is tied up or occupied for nonproductive periods.

A further economic consideration in the production of these wafers is their breakage or cracking due to prior art apparatus and methods. It has typically been the practice to place the wafer upon a hard surface, for example, steel, the pedestal for subsequent process steps. As a result, areas of stress are caused by the relative contours during alignment between the wafer and a mask which must be in direct contact for proper photoexposure or etching and viewing. These forces and resulting strains often cause malfunction or actual fissure in the wafer. Furthermore, in this connection as well as with regard to the earlier discussion, the prior art machines typically utilize complex mechanical linkages including gimbals and the like to accomplish several degrees of freedom of movement, thereby to correct inaccuracies in the planarity of the surfaces of the mask or wafer.

A further ramification implied by the above is that economically beneficial mass production techniques which might otherwise be incorporated in the manufacture of these wafers is precluded in accordance with prior art practice by the tie up for long periods of time, for example that required for the alignment steps to the full exposure steps, of the required quantities of equipment for each wafer.

SUMMARY OF THE INVENTION

Accordingly, it is an object of the present invention to provide a novel system and method for the preparation and manufacture of semiconductor wafers which are not subject to these and other disadvantages and limitations of the prior art.

It is another object to provide such apparatus for alignment and jigging of mask and wafer which is mechanically simple, rugged, reliable, and sufficiently inexpensive to permit the simultaneous use or storing of large numbers thereof for incorporation by various mask production techniques.

It is another object to provide such apparatus which precludes deleterious stressing of the wafer during the alignment and jigging thereof with respect to a masking member.

Briefly these and other objects are achieved in accordance with the structural and method aspects of one example of the invention which includes a small jig body including sheets of rubberlike mounting cushion on the top surface thereof and surrounded by an O-ring seal. A first vacuum chamber within the body communicates with the mounting cushion through a plurality of capillary ducts which pass from the chamber through the cushion sheet. The resulting array of openings through the sheet all lie within the perimeter of a semiconductor wafer emplaced thereover. A vacuum may then be pulled in the chamber causing the atmospheric pressure to secure the wafer onto the mounting cushion and to seal the capillaries.

A second set of similar capillaries are arrayed between the periphery of the wafer and the O-ring and these communicate with a second vacuum chamber within the jig body. A masking element is emplaced over the wafer covering the wafer, the mounting cushion, and the O-ring; then a vacuum is pulled in the second chamber. The mask is then urged uniformly downwardly sealing all the capillaries and securing the placement from the mask with respect to the wafer. The vacuum in the first chamber may then be released to make even more uniform the compressive contact between the juxtaposed surfaces of the wafer and mask.

The line between the vacuum pump and the second chamber includes a toggle valve affixed to the jig body whereby once the desired vacuum has been created in the second chamber, the valve may be actuated to hold the reduced pressure therewithin. The compact assembly, then, comprising the vacuum-clamped mask and wafer may then be removed from the vacuum jigging station and placed on a conveyor belt, stored for a subsequent mask process, or otherwise prepared for a subsequent step in the manufacture of the semiconductor device or component element therefor.

Further details of these and other novel features and their operation as well as additional objects and advantages of the invention will become apparent and be best understood from a consideration of the following description taken in connection with the accompanying drawing which is presented by way of illustrative example only and in which:

DESCRIPTION OF THE PREFERRED EMBODIMENTS

Figure 1:
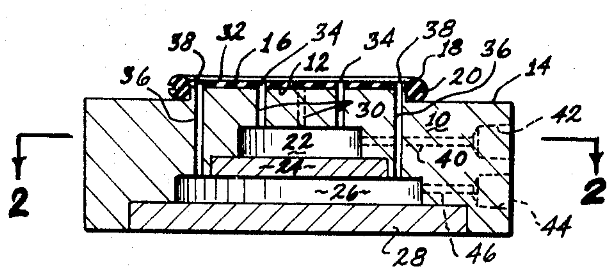
FIG. 1 is a vertical cross-sectional view of an example of a portion of a vacuum masking jig constructed in accordance with the principles of the present invention.

With specific reference now to the Figures in detail, it is stressed that the particulars shown are by way of example and for purposes of illustrative discussion only and are presented in the cause of providing what is believed to be the most useful and readily understood description of the principles and conceptual aspects of the invention. In this regard no attempt is made to show structural details of the apparatus or to discuss method steps in more detail than is necessary for a fundamental understanding of the invention. The description taken with the drawing will make it apparent to those skilled in the electron device manufacturing art how the several forms of the invention may be embodied in practice. Specifically the detailed showing is not be taken as a limitation upon the scope of the invention which is defined by the appended claims forming, along with the drawing, a part of this specification.

In FIG. 1, the example of the jig fixtures illustrated a body member 10 which is generally in the form of a rectangular right parallelpiped with a short height, circular mounting pedestal 12 extending upwardly from the top surface 14 thereof. The top surface 14 of the pedestal 12 is, in this example, substantially circular and is covered by a resilient mounting sheet 16 formed of neoprene 0.06 inches thick and having, in this example, a hardness of 30 shore. The mounting sheet may be bonded as by vulcanizing to the surface 12.

A sealing O-ring 18 having a toroidal channel 20 formed in the outer surface thereof is shown disposed snugly about the pedestal 12 and the mounting sheet 16. The relation between the thickness of torus of the O-ring 18 and the height of the pedestal 12 is such that the O-ring thickness is normally greater than the height of the pedestal plus the neoprene sheet, but is readily compressible to a total thickness approximately equal to that of the pedestal plus that of the neoprene sheet plus at least a portion of the thickness of the wafer disposed on the mounting surface of the rubberlike sheet.

A first vacuum chamber 22 is formed internally and centrally of the jig body 10. The chamber 22 may be formed by a milled bore and sealed by a bulkhead plate 24. Similarly, a second vacuum chamber 26 is formed below and concentrically with the first chamber 22 and may be sealed off by a plate 28.

A first set of capillaries 30 is formed to communicate between the chamber 22 and the central portion of the mounting, upper surface 32 of the mounting sheet 16. The capillaries 30 terminate in an array of openings 34 which all lie within an end area which may be designated the wafer contact zone.

A second set of capillaries 36 is formed to communicate between the top surface 32 and the second vacuum chamber 26; and these capillaries terminate in an array of openings 38 which lie within the annular area between the wafer contact zone and the outer perimeter of the circular mounting sheet 16.

The chamber 22 constitutes, in this example, a manifold between a wafer holding vacuum duct 40 and the set of capillaries 30, the duct 40 communicates with a fitting recess 42 formed in the external surface of the jig body 10. Similarly, the chamber 26 communicates with a fitting recess 44 through a mask holding vacuum duct 46.

Figure 2:
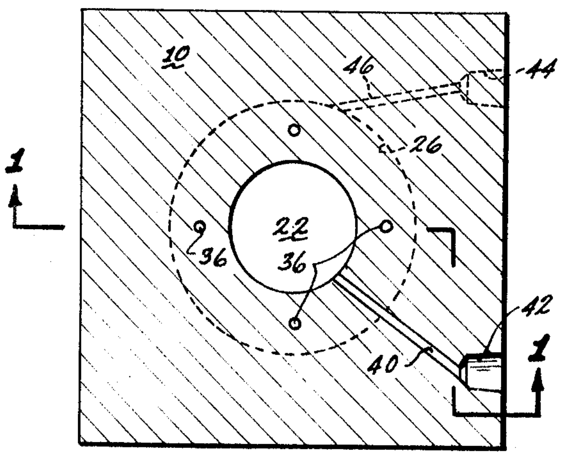
FIG. 2 is a horizontal cross-sectional, simplified view of the structure of FIG. 1 taken along the section reference lines 2–2 thereof.

Referring to FIG. 2, the sectional view is taken through the duct 40, the fitting recess 42, and the vacuum chamber 22 with the chamber 26, its respective duct 46 and fitting recess 44 shown in phantom lines. Note that the capillaries (four in number) of the set 36 is shown extending downwardly into the chamber 26.

Figure 3:
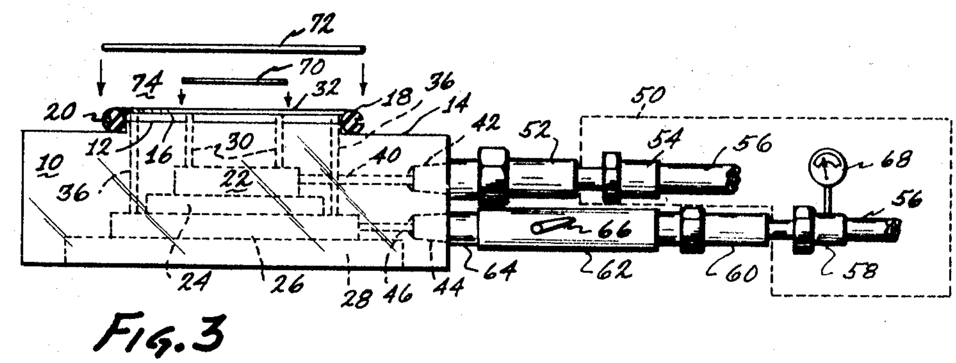
FIG. 3 is a side elevational view, shown partly in phantom, of an example of the invention illustrating its cooperation with a vacuum station and indicating other method steps associated therewith.

In FIG. 3, the assembled jig system including the jig body 10, its pedestal portion 12, the neoprene mounting sheet 16, and the sealing O-ring 18 is shown in place coupled to a vacuum pumping jigging station 50.

A quick coupling fitting 52 is affixed to the fitting recess 42 and is shown coupled through a mating quick release coupling 54 to a vacuum pumping line 56. Similarly, the line 56 is shown affixed through a quick release coupling set 58, 60 to a toggle valve 62 which is mounted upon the jig body 10 by means, in this example, of a fitting 64 connected in the fitting recess 44. An actuator 66 for the toggle valve 62 is indicated as being disposed centrally of the toggle valve 62. A vacuum gauge 68 is shown at the station 50 coupled pneumatically to the vacuum line 56.

In operation the jig is placed at the station 50 and is thereby coupled to the fittings 54, 58. A wafer 70 which has been prepared, for example, photosensitively, and may or may not have had previous transistor elements formed thereon, is emplaced on the central mounting surface 32, that is the wafer contact zone. When the wafer is properly emplaced, a vacuum may be drawn in the chamber 22 through the wafer-holding duct 40. The resultant reduced pressure is in turn communicated through the capillaries 30 to the interface between the wafer 70 and the area 32, whereby atmospheric pressure creates an evenly distributed downward clamping force on the wafer.

While the wafer-holding vacuum is maintained, a prepared masking member 72 is emplaced over the O-ring 18. A vacuum is then pulled in the chamber 26 which is transferred to the annular region 74 radially without the wafer contact zone circular area 32 through the capillaries 36.

The evacuation of the region 74 results in a downward atmospheric force on the masking member 72 which compresses the O-ring 18 and creates a complete seal between the masking member and the chamber 26.

At this time, the actuator 66 may be thrown to reverse the state of its toggle valve 62 thereby to complete the isolation of the reduced pressure, or vacuum, created in the chamber 26 and its associated ducts and capillaries. The jig assembly may then be removed from the station 50 and the vacuum in the chamber 22 released. This relieves a portion of the holddown force on the wafer 70 as atmospheric pressure is permitted into the capillaries 30, and the result is an evenly distributed and more forceful and thereby secure juxtaposed contact between the wafer and mask, which is advantageous with respect to later photoexposing or viewing and risk of fracture of either member.

Figure 4:
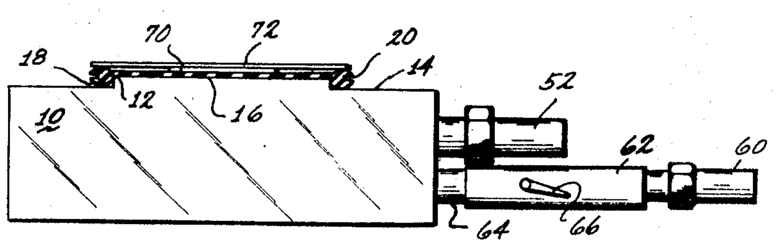
FIG. 4 is an elevational view of the structure of FIG. 3 illustrating further steps in the practice of the invention.

The jig assembly with the mask and wafer firmly in register with each other and clamped to the jig body is then, as shown in FIG. 4, an independent integral unit which may be placed upon a conveyor belt as for a prescribed exposure of the photosensitive materials; or the clamped unit may be set aside or stored until it is desired to mask process a large plurality of the wafers 70. It is to be noted that such shelving can be particularly economic because of the extremely low cost of the total jig assembly which would be tied up or occupied during such shelving.

There have thus been disclosed and described a number of examples of several aspects of a vacuum masking method and apparatus which achieve the objects and exhibit the advantages set forth hereinabove. It may further be noted however that the same apparatus and methods as have been described herein may be utilized once the base masking, for example, has occurred and it is desired subsequently to mask, for example, to form the emitters in proper registration with the bases previously formed. The only additional step which may thereby be required is the actual alignment with a proper aligning apparatus and technique, such as typically by the use of microscopes and the like. As discussed above, however, it should be noted that the precision apparatus is necessary only for the purpose and only during the time required for the actual aligning. The jig then with the wafer properly aligned with the mask may be removed and passed as an integral unit on to an exposure station, and again it may be seen that the machine therefore has no wasted time waiting for exposure to occur as is the practice in accordance with the prior art.

We claim:

1. Manufacturing Jig for use at a jigging station for holding in predetermined alignment a masking element and a semiconductor wafer element in juxtaposed planar contact comprising:

jig body including a deformable, substantially planar mounting means including a substantially circular sheet of rubberlike material larger in area than that of the wafer and bonded to said mounting means, a first vacuum chamber disposed therewithin, first duct means communicating from said first vacuum chamber, first capillary means comprising a set of small ducts communicating from said first vacuum chamber to said mounting means and terminating in an array of openings in said mounting means within a circular area whose radius is less than that of said wafer, second vacuum chamber disposed within said jig body, second duct means communicating from said second vacuum chamber, second capillary means communicating from said second vacuum chamber through said mounting means and comprising a set of small ducts terminating in an array of openings in said mounting means in the annular area outside of said circular area, first and second disconnectable fittings carried by said jig body in airtight communication with respect to ones of said first and second duct means for selective connection to vacuum lines at said jigging station; and vacuum switch means interposed between said second duct means and said second fitting for securing said second vacuum chamber with respect to airflow through said second duct means.

2. The invention according to claim 1 in which said horizontal planar surface of said jig body is a short, circular pedestal portion of said jig body and which is substantially congruent in area with that of said mounting means; and which further includes an O-ring sealing member disposed snugly about said pedestal and said mounting means, the torus thickness of said O-ring being normally greater than the height of said pedestal plus the thickness of said rubberlike sheet of material but which is compressible to less than said height plus the thickness of said sheet of material.

3. Apparatus for holding in predetermined alignment first and second elements in planar contact comprising:

jig means defining first and second isolated vacuum chambers and having a surface of deformable rubberlike material;

said surface defining a first plurality of openings in communication with said first vacuum chamber;

said surface defining a second plurality of openings in communication with said second vacuum chamber and surrounding said first plurality of openings;

coupling means on said jig means for releasably connecting said first and second vacuum chambers to a source of vacuum;

and control means for holding a vacuum in said second vacuum chamber upon disconnecting said first and second vacuum chambers from said source of vacuum thereby releasing a vacuum in said first vacuum chamber.